United States Patent
Hirano et al.

(10) Patent No.: US 11,320,489 B2
(45) Date of Patent: May 3, 2022

(54) FIELD WINDING INTERLAYER SHORT-CIRCUIT DETECTION APPARATUS AND FIELD WINDING INTERLAYER SHORT-CIRCUIT DETECTION METHOD

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Toshio Hirano, Yokohama Kanagawa (JP); Yoshihiro Taniyama, Tokyo (JP); Masafumi Fujita, Yokohama Kanagawa (JP); Koji Ando, Yokohama Kanagawa (JP); Yoshinori Torii, Kawasaki Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 100 days.

(21) Appl. No.: 16/939,517

(22) Filed: Jul. 27, 2020

(65) Prior Publication Data
US 2021/0033674 A1 Feb. 4, 2021

(30) Foreign Application Priority Data
Jul. 29, 2019 (JP) .............................. JP2019-138829

(51) Int. Cl.
*G01R 31/34* (2020.01)
*G01R 31/52* (2020.01)

(52) U.S. Cl.
CPC .......... *G01R 31/346* (2013.01); *G01R 31/52* (2020.01)

(58) Field of Classification Search
CPC .............................. G01R 31/346; G01R 31/52
USPC .................... 324/546, 642, 637, 629, 600
See application file for complete search history.

(56) References Cited

U.S. PATENT DOCUMENTS

| 2004/0027224 A1* | 2/2004 | Giandalia | H01F 27/323 336/200 |
|---|---|---|---|
| 2016/0217915 A1* | 7/2016 | Kazakov | H01F 27/25 |
| 2021/0293886 A1* | 9/2021 | Sato | G01R 31/346 |

FOREIGN PATENT DOCUMENTS

| EP | 0 274 691 A1 | 7/1988 |
|---|---|---|
| EP | 3 260 874 A1 | 12/2017 |
| JP | 1988-031448 A | 2/1988 |
| JP | H02-119560 A | 5/1990 |
| JP | 2009-300250 A | 12/2009 |

* cited by examiner

*Primary Examiner* — Giovanni Astacio-Oquendo
(74) *Attorney, Agent, or Firm* — Foley & Lardner LLP

(57) ABSTRACT

According to the embodiment, a field winding interlayer short-circuit detection apparatus comprises: a field winding resistance calculator to calculate, for a field winding of a rotating electrical machine, a field winding resistance calculated value from a detected value of a field winding current and a detected value of a field winding voltage; a determiner to determine presence or absence of an interlayer short-circuit in the field winding by using a comparison result between the field winding resistance calculated value and the reference resistance value.

5 Claims, 10 Drawing Sheets

FIELD WINDING INTERLAYER SHORT-CIRCUIT DETECTION APPARATUS AND FIELD WINDING INTERLAYER SHORT-CIRCUIT DETECTION METHOD

CROSS-REFERENCE TO RELATED APPLICATION

This application is based upon and claims the benefit of priority from Japanese Patent Application No. 2019-138829 filed on Jul. 29, 2019, the entire content of which is incorporated herein by reference.

FIELD

The embodiments of this invention relate to a field winding interlayer short-circuit detection apparatus and a field winding interlayer short-circuit detection method using it.

BACKGROUND

A rotating electrical machine such as a turbine generator typically has a field winding in a rotor or a stator thereof. The field winding is constituted by multilayered conductors insulated from one another to generate a magnetic field.

An interlayer insulation is provided so as to be sandwiched between the conductors in adjacent layers constituting the field winding to insulate the adjacent conductors from each other, thereby preventing a short-circuit current from flowing between the conductors.

A short-circuit between the conductors, which is called "interlayer short-circuit" may occur due to degradation or damage of the interlayer insulation. When the short circuit occurs, the effective number of turns of the winding is reduced, which may lead to degradation of performance of the entire rotating electrical machine, such as a reduction in a magnetic field to be generated. Thus, early detection of the interlayer short-circuit is important for maintaining the performance of the entire system incorporating the rotating electrical machine or the entire plant provided therewith. The interlayer insulation may degrade with time, and the degradation may be accelerated by a temperature change of the winding associated with a change in an operation state. Thus, such a rotating electrical machine that partial load or power factor often varies has a high risk of occurrence of the interlayer short-circuit and thus particularly requires early detection of the interlayer short-circuit.

In order to detect the interlayer short-circuit during operation of a rotating electrical machine, there has been proposed a method that calculates a winding resistance based on a voltage applied to the winding and a current flowing through the winding and detects the short-circuit by a change in the winding resistance. Further, there has been also proposed a method that removes influence of temperature on the winding resistance based on measurement results of winding temperature. Such method is described in Japanese Patent Application Laid-Open Publication No. Sho 63-031448, and Japanese Patent Application Laid-Open Publication No. 2009-300250, the entire content of which is incorporated herein by reference.

During operation of a rotating electrical machine, a field winding resistance changes depending on a field winding temperature even in the absence of abnormality, so that by monitoring only the field winding resistance, it is difficult to discriminate whether the change in the field winding resistance is caused due to a temperature change or short-circuit.

This can be solved by monitoring the field winding temperature in addition to the field winding resistance; however, in many cases, the field winding temperature is not monitored particularly in a rotor. Even in a case where the field winding temperature is monitored, the number of temperature measurement points is insufficient for grasping a temperature distribution in the entire field winding.

Assuming that the number of turns of the field winding is 100, a reduction in the resistance of the field winding is $1/100$ due to short circuit between adjacent conductor layers, and the resultant current variation is less than 1%. On the other hand, in an operation where partial load or power factor often varies, field current significantly varies. Further, even in a rated load operation with a constant power factor, the field current is used to perform regulation so as to make constant the field whose state can vary. It follows that the field current fluctuates; the fluctuation width at this time is typically, for example, about 2% to 3%. That is, the fluctuation width (less than 1%) of the current due to the short circuit is smaller than the fluctuation width (about 2% to 3%) of the current in a normal time. Thus, it is difficult to determine only from the current fluctuation whether the fluctuation is caused due to the short circuit.

DETAILED DESCRIPTION

The embodiments of the present invention have been made to solve the above problem, and the object thereof is to detect the interlayer short-circuit in the field winding in an early stage even in a rotating electrical machine with varying operation conditions.

According to an aspect of the present invention, there is provided a field winding interlayer short-circuit detection apparatus comprising: a field winding resistance calculator to calculate, for a field winding of a rotating electrical machine, a field winding resistance calculated value from a detected value of a field winding current and a detected value of a field winding voltage; a reference resistance value derivation part to derive a reference resistance value; and a determiner to determine presence or absence of an interlayer short-circuit in the field winding by using a comparison result between the field winding resistance calculated value and the reference resistance value.

With reference to the accompanying drawings, a field winding interlayer short-circuit detection apparatus and a field winding interlayer short-circuit detection method according to embodiments of the present invention will be described. The parts that are the same as, or similar to, each other are represented by the same reference symbols and will not be described repeatedly.

First Embodiment

Figure 1:
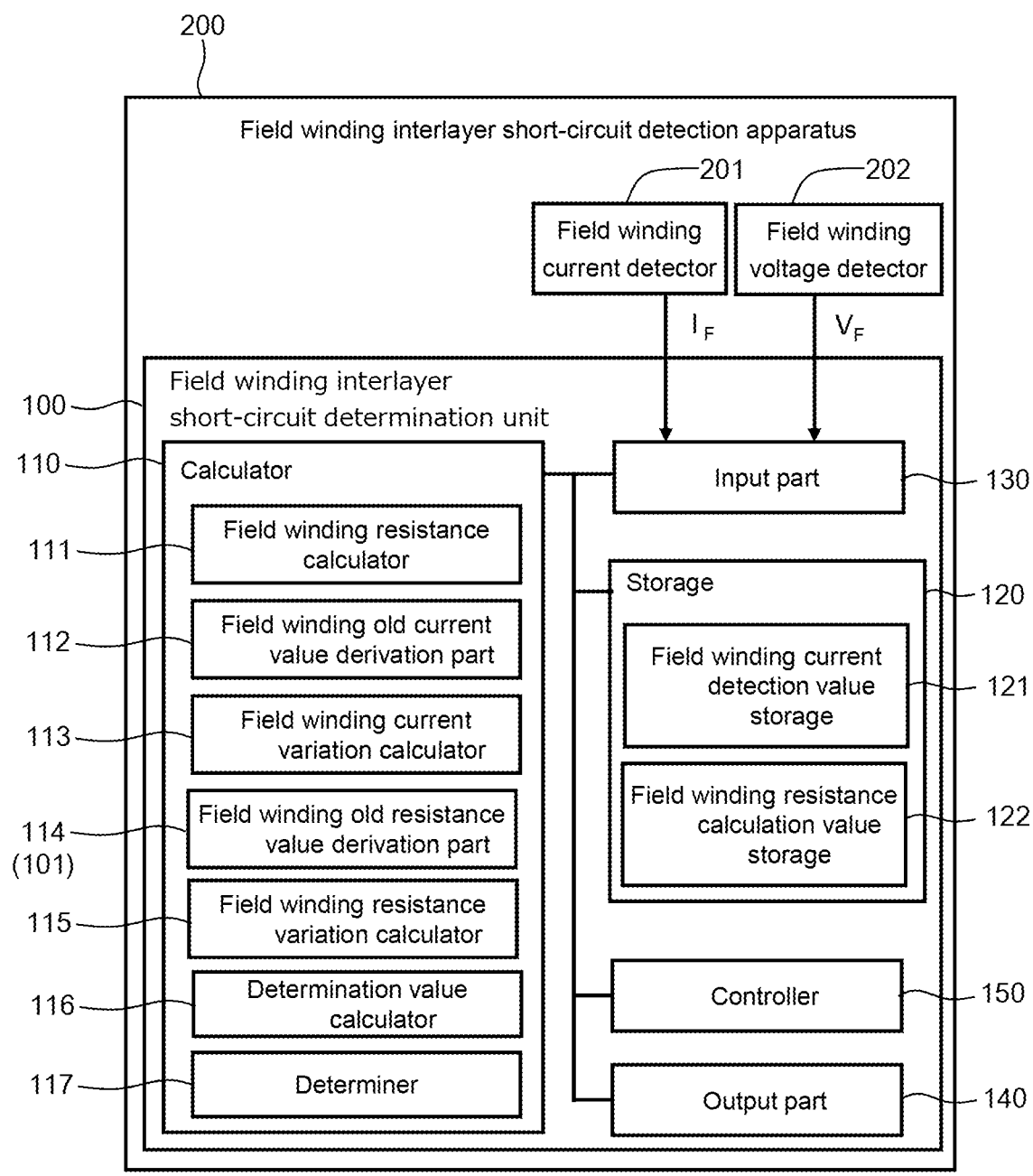
FIG. 1 is a block diagram illustrating the configuration of a field winding interlayer short-circuit detection apparatus for a rotating electrical machine according to a first embodiment.

FIG. 1 is a block diagram illustrating the configuration of a field winding interlayer short-circuit detection apparatus for a rotating electrical machine according to a first embodiment.

A field winding interlayer short-circuit detection apparatus 200 includes a field winding interlayer short-circuit determination unit 100, a field winding current detector 201, and a field winding voltage detector 202. The field winding interlayer short-circuit determination unit 100 includes a calculator 110, a storage 120, an input part 130, an output part 140, and a controller 150.

The input part 130 receives output signals from the field winding current detector 201 and field winding voltage detector 202. The output signals from the field winding current detector 201 and the field winding voltage detector 202, i.e., a field winding current detected value $I_F$ and a field winding voltage detected value $V_F$ may be analog or digital signals and, when receiving analog signals as the output signals, the input part 130 digitizes them. The input part 130 outputs, at predetermined sampling intervals, the digitized field winding current detected value $I_F$ and the digitized field winding voltage detected value $V_F$ to the calculator 110 and the digitized field winding current detected value $I_F$ to the storage 120.

The output part 140 outputs determination results. The output part 140 may have a display. The controller 150 manages information exchange between constituent elements in the field winding interlayer short-circuit determination unit 100, outputs an instruction concerning progress of calculation processing, and other control operations.

The calculator 110 includes a field winding resistance calculator 111, a field winding old current value derivation part 112, a field winding current variation calculator 113, a field winding old resistance value derivation part 114 as a reference resistance value derivation part 101, a field winding resistance variation calculator 115, a determination value calculator 116, and a determiner 117. The storage 120 includes a field winding current detected value storage 121 and a field winding resistance calculated value storage 122.

The field winding resistance calculator 111 calculates a field winding resistance calculated value $R_F$ based on the field winding current detected value $I_F$ and the field winding voltage detected value $V_F$ that the input part 130 receives respectively from the field winding current detector 201 and the field winding voltage detector 202 and outputs to the field winding resistance calculator 111. Specifically, the field winding resistance calculator 111 divides the field winding voltage detected value $V_F$ by the field winding current detected value $I_F$ to obtain the field winding resistance calculated value $R_F$. The field winding resistance calculated value $R_F$ calculated by the field winding resistance calculator 111 is output therefrom and stored in the field winding resistance calculated value storage 122 of the storage 120 in each time.

The field winding old current value derivation part 112 reads out necessary data from field winding current detected value data accumulating the field winding current detected values $I_F$ stored each time in the field winding current detected value storage 121 of the storage 120 and derives a field winding old current value $I_F'$.

The field winding old current value may be a field winding current detected value at a previous sampling period or at a previous, prescribed sampling period. Alternatively, the field winding old current value may be the average value of the field winding current detected values obtained at respective sampling times in a given time width. In this case, as the sampling values to be averaged, some field winding current detected values may be extracted from all the field winding current detected values at predetermined intervals. The above average value may be calculated for each predetermined time width, or the moving average of the field winding current detected values may be calculated.

The field winding current variation calculator 113 calculates a field winding current variation $\Delta I_F$ based on the field winding old current value $I_F'$ derived by the field winding old current value derivation part 112 and the field winding current detected value $I_F$ received from the input part 130. The field winding current variation $\Delta I_F$ is calculated by subtracting the field winding old current value $I_F'$ from the field winding current detected value $I_F$.

The field winding old resistance value derivation part 114 as the reference resistance value derivation part 101 reads out necessary data from field winding resistance calculated value data stored in the field winding resistance calculated value storage 122 of the storage 120 and derives a field winding old resistance value $R_F'$ as a reference resistance value. The calculation method for the field winding old resistance value $R_F'$ is preferably the same as the method in which the field winding old current value derivation part 112 derives the field winding old current value $I_F'$ but may be different therefrom.

The field winding resistance variation calculator 115 calculates a field winding resistance variation $\Delta R_F$ based on the field winding old resistance value $R_F'$ derived by the field winding old resistance value derivation part 114 and the field winding resistance calculated value $R_F$ calculated by the field winding resistance calculator 111. The field winding resistance variation $\Delta R_F$ is calculated by subtracting the field winding old resistance value $R_F'$ from the field winding resistance calculated value $R_F$.

The determination value calculator 116 calculates the following determination condition values for determination to be made by the determiner 117.

The determination condition values include:
a first determination condition value (rate of change in the field winding current detected value $I_F$) $\Delta I_F/I_F'$;
a second determination condition value $1/(n_{r0}-1)$;
a third determination condition value (rate of change in the field winding resistance calculated value $R_F$) $\Delta R_F/R_F'$; and
a fourth determination condition value $1/n_{r0}$, where $n_{r0}$ is the number of turns of the field winding in a normal state.

The determiner 117 determines, regarding the determination condition values calculated by the determination value calculator 116, whether both a determination condition expression (1) which compares the first determination condition value and the second determination condition value and a determination condition expression (2) which compares the third determination condition value and the fourth determination condition value are satisfied as follows.

$$\Delta I_F/I_F' > 1/(n_{r0}-1) \qquad (1)$$

$$\Delta R_F/R_F' < -1/n_{r0} \qquad (2)$$

The determination condition expression (2) indicates that the value of the change rate ($\Delta R_F/R_F'$) of the field winding resistance calculated value $R_F$ as the third determination condition value is negative and that the absolute value thereof is larger than the fourth determination condition value ($1/n_{r0}$).

Figure 2:
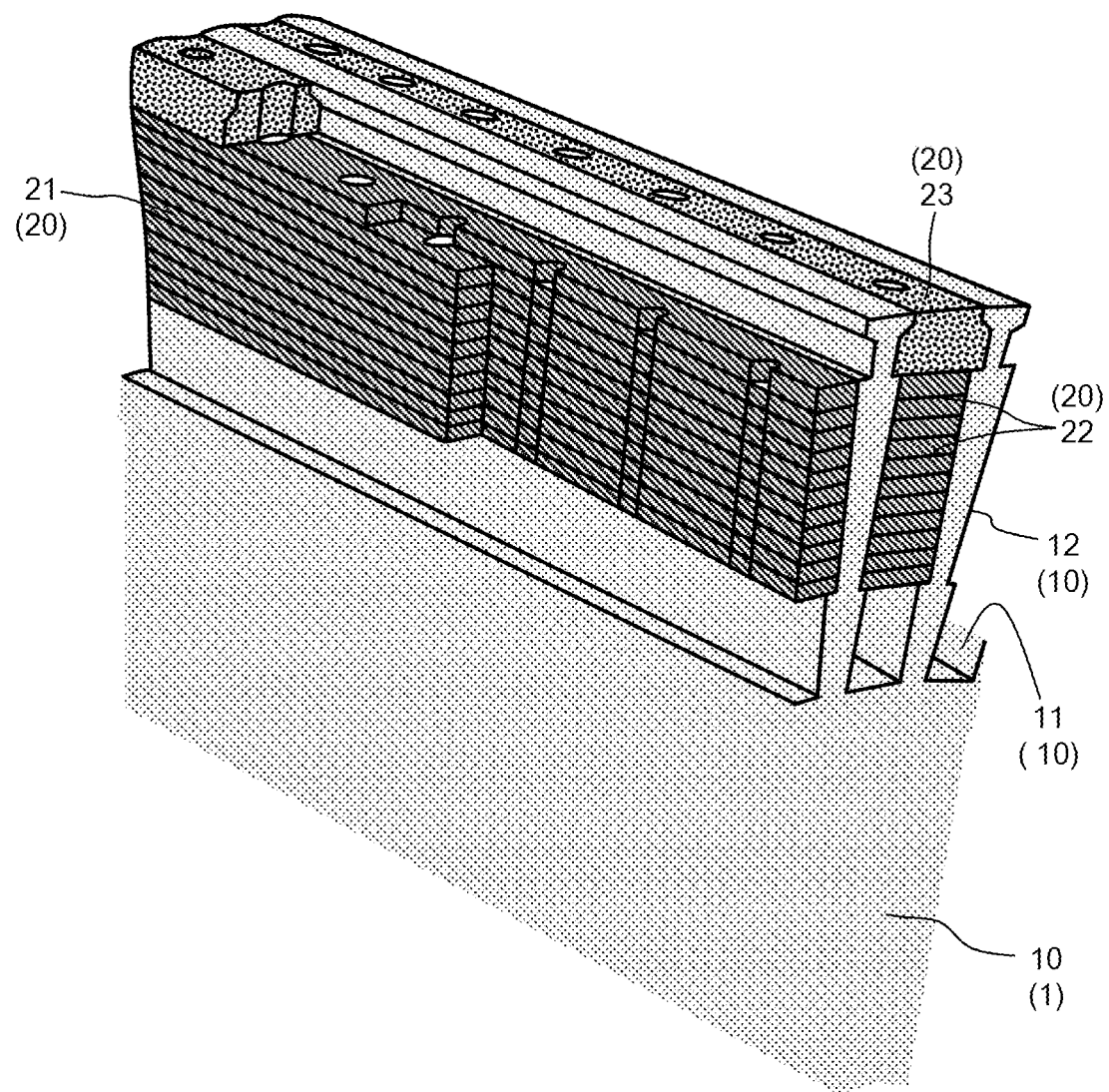
FIG. 2 is a partial perspective view conceptually illustrating a rotor core and a field winding of a rotating electrical machine to which the field winding interlayer short-circuit detection method according to the first embodiment is applied.

FIG. 2 is a partial perspective view conceptually illustrating a rotor core and a field winding of a rotating electrical machine to which the field winding interlayer short-circuit detection method according to the first embodiment is applied. Specifically, FIG. 2 illustrates a partial sector in the circumferential direction of a rotor core 10 of a rotor 1. In FIG. 2, the sector axially extends from the near side to the middle of the sector in the axial direction.

The rotor core 10 has rotor slots 11 in the vicinity of the radial surface thereof. The rotor slots 11 are disposed with circumferential intervals therebetween and axially penetrate the rotor core 10. Two circumferentially adjacent rotor slots 11 form a rotor tooth 12.

Field winding conductors 21 are housed in the rotor slot 11. The field winding conductors 21 constitute a field winding 20 (FIG. 3) and are radially layered with interlayer insulators 22 interposed between the layers. A wedge 23 is provided radially outside the field winding conductors 21 housed between the rotor teeth 12. The wedge 23 is engaged with the rotor teeth 12 on both circumferential sides thereof to be supported by the rotor teeth 12. The wedge 23 holds the field winding conductors 21 against a radially outward centrifugal force which is caused by rotation of the rotor 1 and applied to the field winding conductors 21.

Figure 3:
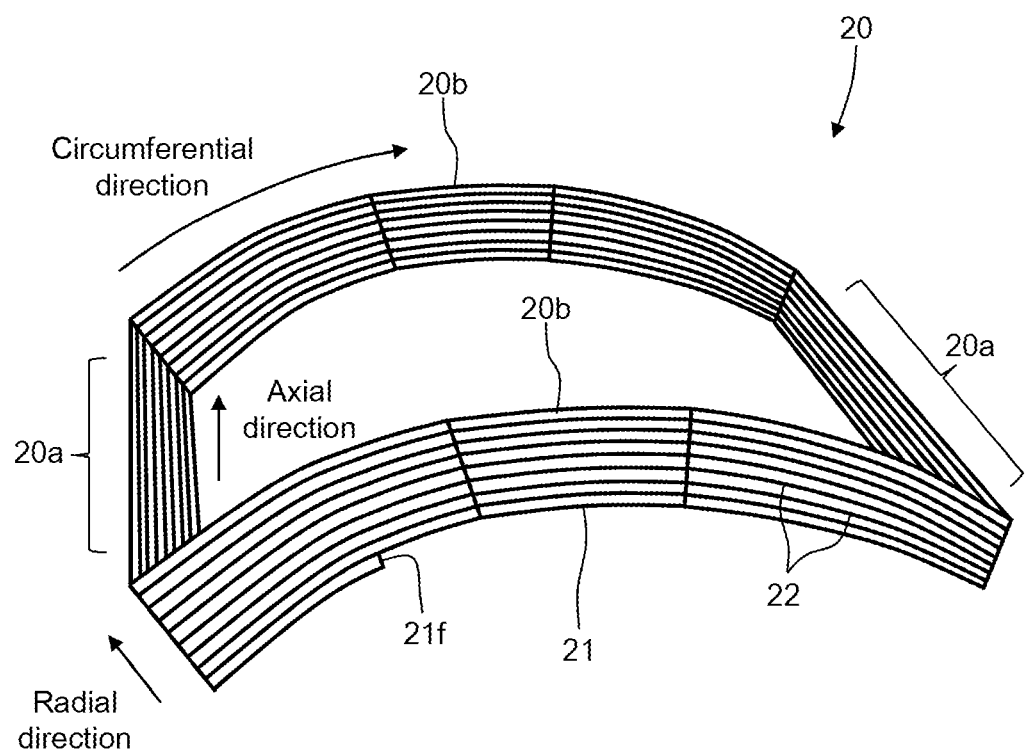
FIG. 3 is a perspective view conceptually illustrating the field winding of the rotating electrical machine to which the field winding interlayer short-circuit detection method according to the first embodiment is applied.

FIG. 3 is a perspective view conceptually illustrating the field winding of the rotating electrical machine to which the field winding interlayer short-circuit detection method according to the first embodiment is applied.

As described above, the field winding 20 penetrates the rotor core 10 (FIG. 2) and is wound like a coil in a layered state with the interlayer insulators 22 interposed between the layers. Thus, as illustrated in FIG. 3, the field winding 20 has a part-inside rotor core 20a and a part-outside rotor core 20b. Two conductor end parts 21f are included in the part-outside rotor core 20b, and only one end part 21f is illustrated in FIG. 3. The conductor end part 21f is connected to the field winding conductor 21 in another slot or to a field DC power source.

When an interlayer short-circuit occurs in the layered field winding conductor 21 as illustrated in FIG. 3, adjacent wound sections of the field winding conductors 21 contact each other. The mutual contact causes a short circuit, with the result that one turn of the field winding 20 is bypassed. That is, assuming that the original effective number of turns of the field winding is $n_{r0}$, it is reduced to $(n_{r0}-1)$. As a result, a field winding resistance R of the field winding 20 and a current I through the field winding 20 change as shown in the following expressions (3) and (4), respectively. In the following expressions (3) and (4), $R_0$ and $I_0$ indicate respectively a field winding resistance value and a field winding current value before occurrence of the interlayer short-circuit.

$$R = R_0 \cdot (n_{r0}-1)/n_{r0} \qquad (3)$$

$$I = I_0 \cdot n_{r0}/(n_{r0}-1) \qquad (4)$$

The above expressions (3) and (4) are used to replace the field winding resistance value $R_0$ and the field winding current value $T_0$ before occurrence of the interlayer short-circuit with the field winding old resistance value $R_F'$ and the field winding old current value $I_F'$, respectively, whereby the above-described determination condition expressions (1) and (2) are derived.

For example, when the number $n_{ro}$ of turns of the field winding 20 is 100, a change in the field winding resistance R due to the occurrence of interlayer short-circuit at one place is 1%.

Figure 4:
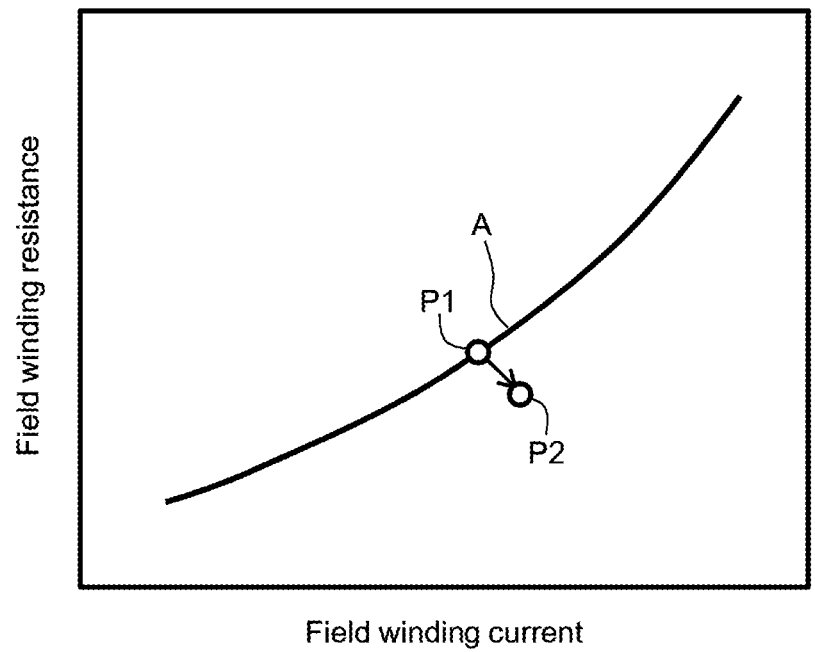
FIG. 4 is a graph for explaining dependency of the field winding resistance on the field winding current and behavior of the field winding resistance upon occurrence of the interlayer short-circuit in the rotating electrical machine to which the field winding interlayer short-circuit detection method according to the first embodiment is applied.

FIG. 4 is a graph for explaining dependency of the field winding resistance on the field winding current and behavior of the field winding resistance upon occurrence of the interlayer short-circuit in the rotating electrical machine to which the field winding interlayer short-circuit detection method according to the first embodiment is applied. The horizontal axis represents the field winding current, and the vertical axis represents the field winding resistance.

A characteristic curve A conceptually indicates the relationship between the field winding resistance and the field winding current in a state where no interlayer short-circuit occurs in the field winding 20. In rotating electrical machines, the value of current flowing in the winding changes with a change in output or power factor. For example, when a current increases, a copper loss in the winding also increases to increase the winding temperature, with the result that the winding resistance also increases. That is, also in a normal state, an increase in current increases resistance (upward to the right in the graph of FIG. 4), and a reduction in current reduces resistance (downward to the left in the graph of FIG. 4).

When the interlayer short-circuit occurs in an operation state P1 at a given voltage and temperature, the operation state shifts to an operation state P2. The field winding resistance in the operation state P2 decreases to $(n_{r0}-1)/n_{r0}$ times the field winding resistance in the operation state P1. Then, the field winding current in the operation state P2 increases to $n_{r0}/(n_{r0}-1)$ times the field winding current in the operation state P1. Thus, in the graph of FIG. 4, the operation state P2 is positioned to the lower right of the operation state P1.

Figure 5:
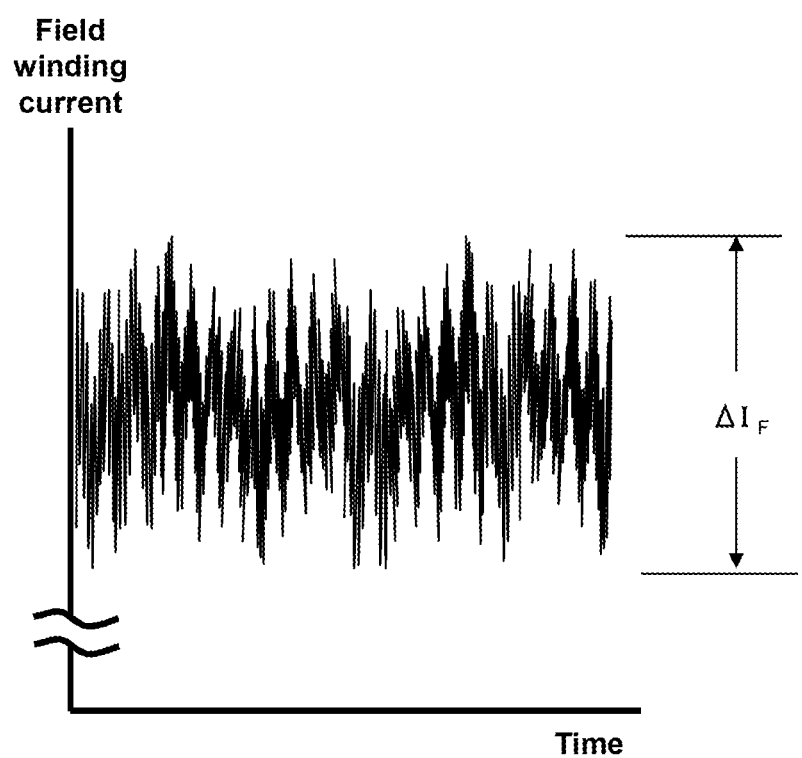
FIG. 5 is a graph conceptually illustrating an example of a temporal change of the field winding current in the rotating electrical machine to which the field winding interlayer short-circuit detection method according to the first embodiment is applied.

FIG. 5 is a graph conceptually illustrating an example of a temporal change of the field winding current in the rotating electrical machine to which the field winding interlayer short-circuit detection method according to the first embodiment is applied. The horizontal axis represents time, and the vertical axis represents the field winding current. The field winding current fluctuates through regulation of a field current for generating a field corresponding to the amount of power according to output or power factor. The fluctuation period is, for example, on the order of minutes, and this fluctuation fluctuates in a longer period. A field winding current change amount $\Delta I_{F2}$ is, for example, about 2% to 3% of the field winding current value. That is, it is usually difficult to determine the presence or absence of the interlayer short-circuit only from a change in the field winding current value.

To detect the field winding interlayer short-circuit, the sampling interval at which the input part 130 receives the output signal of the field winding current detected value $I_F$ from the field winding current detector 201 and the output signal of the field winding voltage detected value $V_F$ from the field winding voltage detector 202 needs to be sufficiently smaller than the above fluctuation period of the field winding current, for example, a value on the order of seconds or smaller.

As described above, it is usually difficult to determine the presence or absence of the interlayer short-circuit only from a change in the field winding current value, so that, in the present embodiment, the presence or absence of the interlayer short-circuit is determined based on a combination of the determination condition expressions: the determination condition expression (1) and determination condition expression (2).

Figure 6:
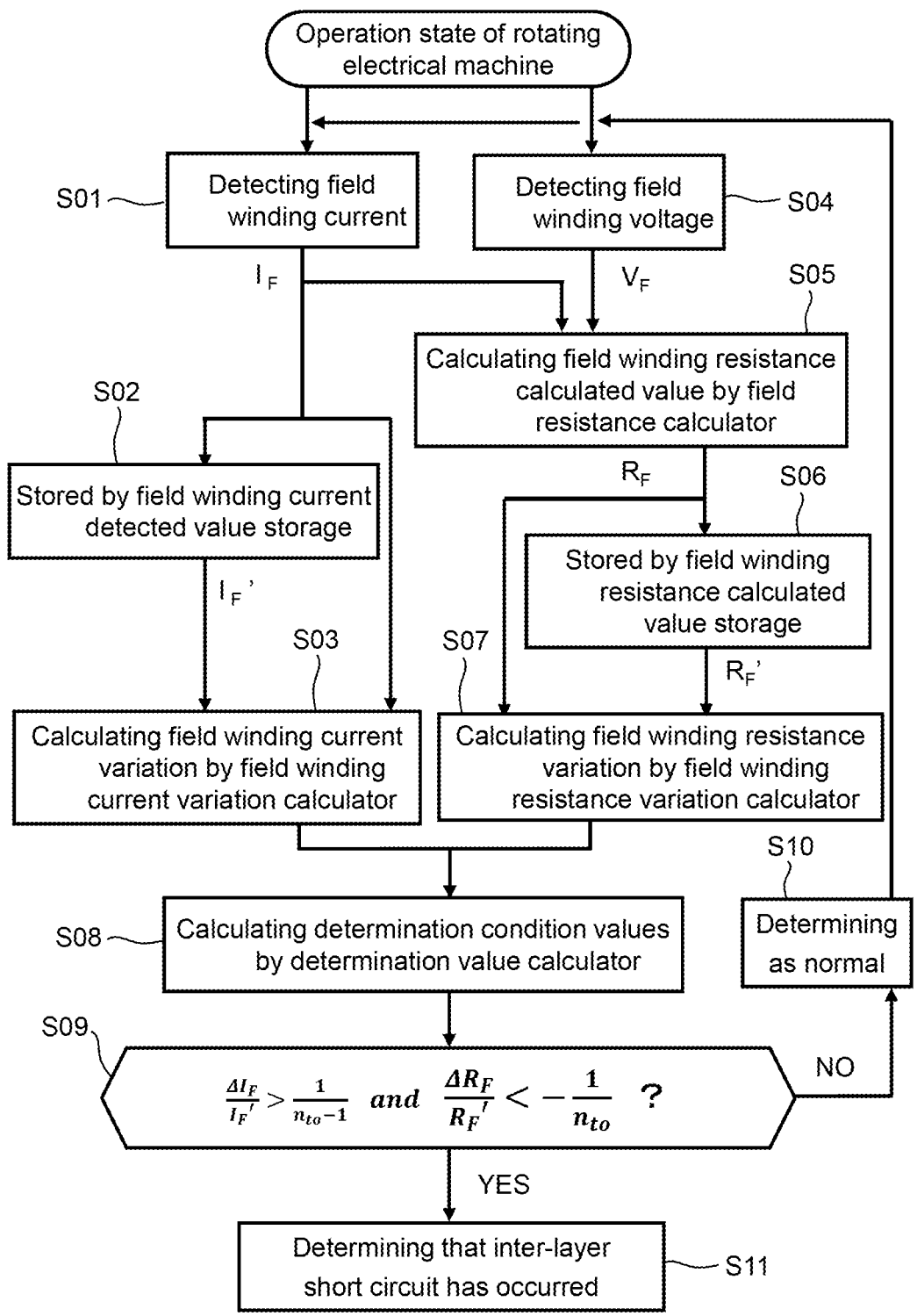
FIG. 6 is a flowchart illustrating the procedure of the field winding interlayer short-circuit detection method for rotating electrical machine according to the first embodiment.

FIG. 6 is a flowchart illustrating the procedure of the field winding interlayer short-circuit detection method for rotating electrical machine according to the first embodiment.

While the rotating electrical machine is in operation, the field winding current detector 201 is used to detect the field winding current (step S01). The detected field winding current detected value $I_F$ is received by the input part 130 and then stored in the field winding current detected value storage 121 (step S02). The field winding current detected value $I_F$ received by the input part 130 is passed each time also to the field winding resistance calculator 111 and field winding current variation calculator 113.

Then, the field winding current variation calculator 113 calculates the field winding current variation $\Delta I_F$ (step S03). More particularly, the field winding old current value derivation part 112 derives the field winding old current value $I_F'$ based on the field winding current detected value data stored in the field winding current detected value storage 121. The field winding current variation calculator 113 calculates the field winding current variation $\Delta I_F$ by subtracting the field winding old current value $I_F'$ derived by the field winding old current value derivation part 112 from the field winding current detected value $I_F$ received from the input part 130.

Meanwhile, the field winding voltage detector 202 is used to detect the field winding voltage (step S04). The detected field winding voltage detected value $V_F$ is received by the input part 130 and passed each time to the field winding resistance calculator 111.

Then, the field winding resistance calculator 111 calculates the field winding resistance calculated value $R_F$ (step S05). More particularly, the field winding resistance calculator 111 calculates the field winding resistance calculated value $R_F$ by dividing the field winding voltage detected value $V_F$ received from the input part 130 by the field winding current detected value $I_F$. The field winding resistance calculated value $R_F$ calculated by the field winding resistance calculator 111 is stored in the field winding resistance calculated value storage 122 (step S06).

Then, the field winding resistance variation calculator 115 calculates the field winding resistance variation $\Delta R_F$ (step S07). More specifically, the field winding old resistance value derivation part 114 as the reference resistance value derivation part 101 derives the field winding old resistance value $R_F'$ as a reference resistance value based on the field winding resistance calculated value data stored in the field winding resistance calculated value storage 122. The field winding resistance variation calculator 115 then calculates the field winding resistance variation $\Delta R_F$ by subtracting the field winding old resistance value $R_F'$ as a reference resistance value derived by the field winding old resistance value derivation part 114 from the field winding resistance calculated value $R_F$ calculated by the field winding resistance calculator 111.

The processing order between a series of processing steps S02 to S03 (first processing step) and a series of processing steps S05 to S07 (second processing step) is not limited. That is, the first and second processing steps may be performed in parallel, or one of the first and second processing steps may be performed prior to the other one of them. Further, alternatively, the first and second processing steps may be performed in parallel in the middle of their execution.

Then, the determination value calculator 116 calculates the determination condition values (step S08). Based on the calculated determination condition values, the determiner 117 determines whether both the determination condition expressions (1) and (2) are satisfied (step S09). When the determination is negative in step S09 (NO in step S09), the determiner 117 determines that the rotating electrical machine is operating normally (step S10) and repeats step S01 and subsequent steps. When the determination is positive in step S09 (YES in step S09), the determiner 117 determines that the interlayer short-circuit has occurred (step S11). Information concerning the determination is externally output through the output part 140.

According to the thus configured field winding interlayer short-circuit detection apparatus and the field winding interlayer short-circuit detection method described above, it is possible to detect the interlayer short-circuit occurring in the winding in an early stage even in a rotating electrical machine with varying operating conditions.

Second Embodiment

Figure 7:
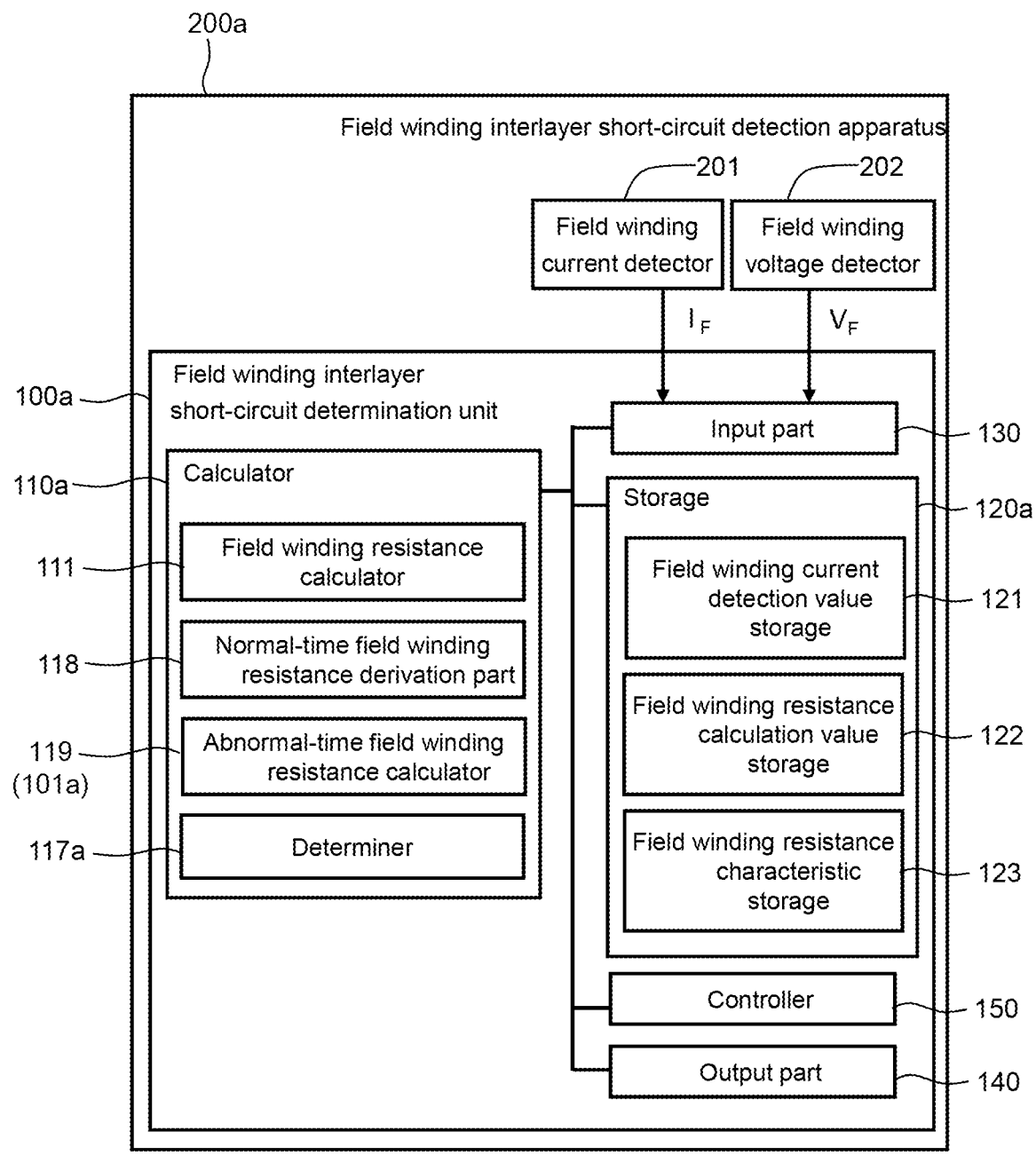
FIG. 7 is a block diagram illustrating the configuration of a field winding interlayer short-circuit detection apparatus for rotating electrical machine according to a second embodiment.

FIG. 7 is a block diagram illustrating the configuration of a field winding interlayer short-circuit detection apparatus for rotating electrical machine according to a second embodiment. The second embodiment is a modification of the first embodiment. A field winding interlayer short-circuit detection apparatus 200a according to the second embodiment includes a field winding interlayer short-circuit determination unit 100a, a field winding current detector 201, and a field winding voltage detector 202. The field winding current detector 201 and the field winding voltage detector 202 have the same configurations as those in the first embodiment.

The field winding interlayer short-circuit determination unit 100a includes a calculator 110a, a storage 120a, an input part 130, an output part 140, and a controller 150. The input part 130, the output part 140, and the controller 150 have the same configurations as those in the first embodiment.

The storage 120a includes a field winding resistance characteristic storage 123 in addition to the field winding current detected value storage 121 and the field winding resistance calculated value storage 122. Other configurations are the same as those in the first embodiment.

The field winding resistance characteristic storage 123 stores normal-time field winding resistance characteristic data and abnormal-time winding resistance characteristic data.

Figure 8:
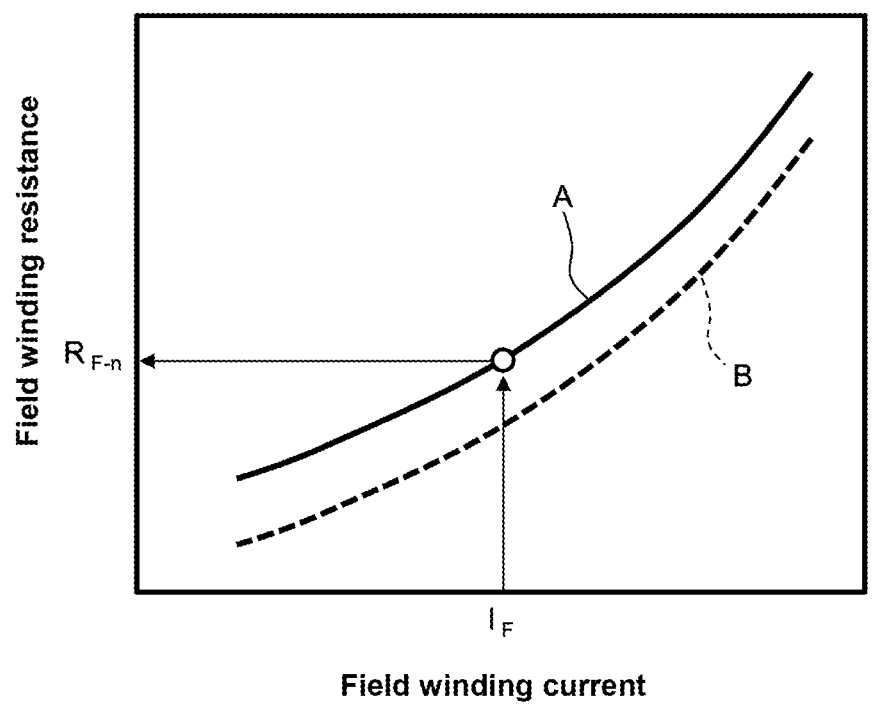
FIG. 8 is a graph illustrating an example of a field winding resistance characteristic stored in the field winding resistance characteristic storage of the field winding interlayer short-circuit detection apparatus for rotating electrical machine according to the second embodiment.

FIG. 8 is a graph illustrating an example of a field winding resistance characteristic stored in the field winding resistance characteristic storage of the field winding interlayer short-circuit detection apparatus for rotating electrical machine according to the second embodiment. The horizontal axis represents the field winding current, and the vertical axis represents the field winding resistance.

A characteristic curve A indicates a normal-time field winding resistance characteristic which is the relational characteristic between the field winding resistance and the field winding current in a normal time, i.e., in a state where no interlayer short-circuit is not occurring in the field winding 20. A characteristic curve B indicates an abnormal-time field winding resistance characteristic which is the relational characteristic between the field winding resistance and the field winding current in an abnormal time, i.e., in a state where the interlayer short-circuit is occurring in the field winding 20.

The characteristic curve A is determined based on design information of a target rotating electrical machine by utilizing dependency of the temperature of the field winding mainly on the field winding current. Specifically, the field winding temperature is estimated considering a copper loss according to the field winding current or heat transfer characteristics around the winding according to the field winding current, and then the winding resistance is estimated from the thus estimated field winding temperature. That is, a change in the winding resistance in a normal time is caused by a change in the winding temperature, and the winding temperature is determined mainly by the current flowing through the winding, so that the winding resistance can be recognized to be the function of the winding current. The characteristic curve A may be corrected after acquisition of operation data in a normal time by using the actually measured winding current and a winding resistance estimated from the actually measured winding current and voltage.

The field winding resistance characteristic storage 123 may store the normal-time field winding resistance characteristic data and the abnormal-time field winding resistance characteristic data in the form of multi-dimensional approximated curve. Alternatively, the field winding resistance characteristic storage 123 may store two-dimensional data at points on the curves A and B, i.e., combination data of the field winding resistance and the field winding current and interpolate the area between the data points with a multi-dimensional approximate curve (or straight line).

The field winding resistance characteristic storage 123 stores at least the normal-time field winding resistance characteristic data although it may store the normal-time field winding resistance characteristic data.

The graph of FIG. 8 will be described once again in the following description of a normal-time field winding resistance derivation part 118.

The field winding interlayer short-circuit determination unit 100a includes a field winding resistance calculator 111, the normal-time field winding resistance derivation part 118, an abnormal-time field winding resistance calculator 119 as a reference resistance value derivation part 101a, and a determiner 117a. The field winding resistance calculator 111 calculates the field winding resistance calculated value $R_F$ based on the field winding current detected value $I_F$ and the field winding voltage detected value $V_F$ as in the first embodiment.

The normal-time field winding resistance derivation part 118 uses the normal-time field winding resistance characteristic data stored in the field winding resistance characteristic storage 123 to derive a normal-time field winding resistance value $R_{F\text{-}n}$ corresponding to the field winding current detected value $I_F$ received by the input part 130, as illustrated in FIG. 8.

The abnormal-time field winding resistance calculator 119 as the reference resistance value derivation part 101a calculates an abnormal-time field winding resistance estimation value $R_{F\text{-}abn}$ as a reference resistance value according to the following expression (5) based on the normal-time field winding resistance value $R_{F\text{-}n}$ derived by the normal-time field winding resistance derivation part 118.

$$R_{F\text{-}abn}=[(n_{t0}-1)/n_{t0}]\cdot R_{F\text{-}n} \qquad (5)$$

The determiner 117a uses the field winding resistance calculated value $R_F$ calculated by the field winding resistance calculator 111 and the abnormal-time field winding resistance estimation value $R_{F\text{-}abn}$ as the reference resistance value calculated by the abnormal-time field winding resistance calculator 119 to determine the presence or absence of the interlayer short-circuit based on the following expression (6).

$$|R_F-R_{F\text{-}abn}|<\alpha \qquad (6), \text{or}$$

$$R_{F\text{-}abn}-\alpha<R_F<R_{F\text{-}abn}+\alpha$$

The determination width a is a sufficiently small predetermined positive real number for determining that the field winding resistance calculated value $R_F$ is close to the abnormal-time field winding resistance estimation value $R_{F\text{-}abn}$. The determination width a is set considering evaluation accuracy (considering, e.g., influence of a temperature at the time of the creation of normal-time field winding resistance characteristic data), ease of discrimination between a fluctuation in the resistance value in a normal state and that in the presence of the interlayer short-circuit, and the like. In the expression (6), α is the dimension of the resistance value although α may be made dimensionless based on, for example, the field winding resistance calculated value $R_F$.

Figure 9:
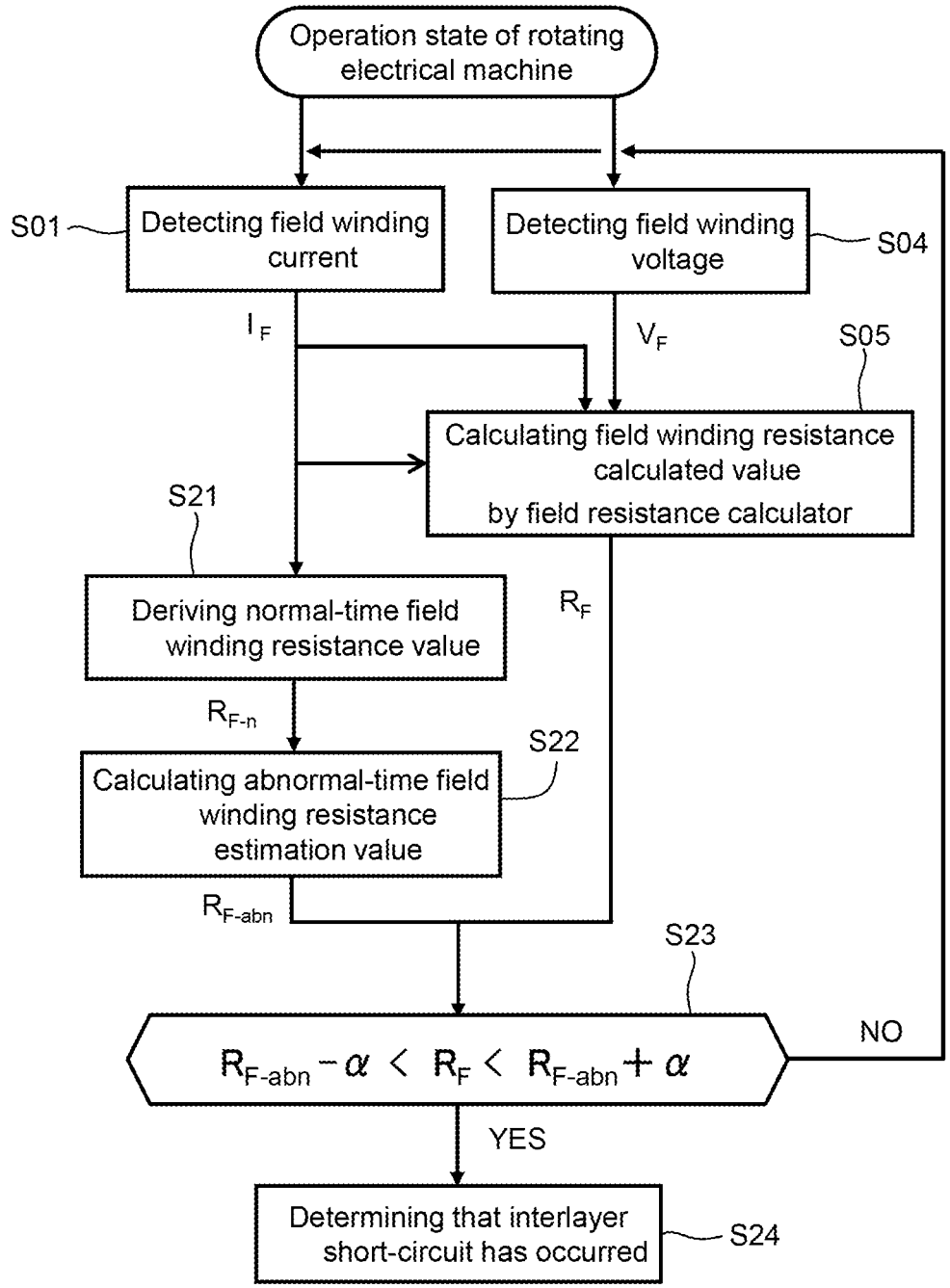
FIG. 9 is a flowchart illustrating the procedure of the field winding interlayer short-circuit detection method for rotating electrical machine according to the second embodiment.

FIG. 9 is a flowchart illustrating the procedure of the field winding interlayer short-circuit detection method for rotating electrical machine according to the second embodiment.

While the rotating electrical machine is in operation, the field winding current detector 201 is used to detect the field winding current (step S01). The detected field winding current detected value $I_F$ is received by the input part 130 and passed each time to the field winding resistance calculator 111 and the normal-time field winding resistance derivation part 118.

Further, in parallel to the detection of the field winding current, the field winding voltage detector 202 is used to detect the field winding voltage (step S04). The detected field winding voltage detected value $V_F$ is received by the input part 130 and passed each time to the field winding resistance calculator 111.

Then, the field winding resistance calculator 111 calculates the field winding resistance calculated value $R_F$ (step S05). More particularly, the field winding resistance calculator 111 calculates the field winding resistance calculated value $R_F$ by dividing the field winding voltage detected value $V_F$ received from the input part 130 by the field winding current detected value $I_F$.

Then, the normal-time field winding resistance derivation part 118 derives the normal-time field winding resistance value $R_{F-n}$ based on the normal-time field winding resistance characteristic data stored in the field winding resistance characteristic storage 123, as illustrated in FIG. 8 (step S21). Then, the abnormal-time field winding resistance calculator 119 as the reference resistance value derivation part 101a calculates the abnormal-time field winding resistance estimation value $R_{F-abn}$ as a reference resistance value based on the normal-time field winding resistance value $R_{F-n}$ derived by the normal-time field winding resistance derivation part 118 (step S22).

Then, the determiner 117a determines whether the expression (6) is satisfied based on the field winding resistance calculated value $R_F$ calculated by the field winding resistance calculator 111 and abnormal-time field winding resistance estimation value $R_{F-abn}$ calculated by the abnormal-time field winding resistance calculator 119 (step S23).

When the determination is negative in step S23 (NO in step S23), step S01 and step S04 and subsequent steps are repeated. When the determination is positive in step S23 (YES in step S23), the determiner 117a determines that the interlayer short-circuit has occurred (step S24).

The present embodiment may be modified as follows. The field winding resistance characteristic storage 123 is required to store the abnormal-time field winding resistance characteristic data, and the presence or absence of the interlayer short-circuit is determined based on whether a combination of the field winding current detected value $I_F$ received by the input part 130 and the field winding resistance calculated value $R_F$ calculated by the field winding resistance calculator 111 exists substantially on a characteristic curve B of the graph of FIG. 10.

Figure 10:
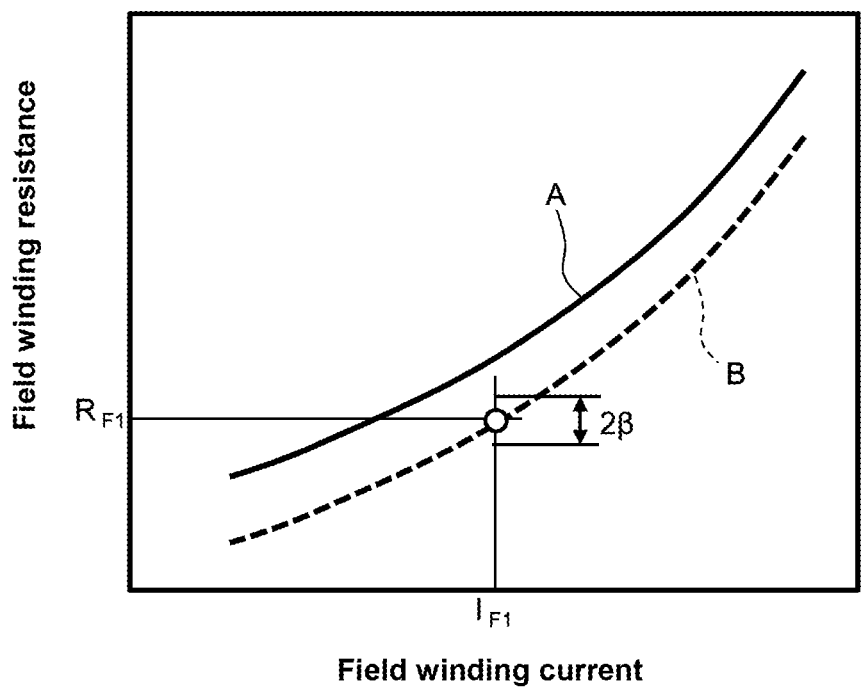
FIG. 10 is a graph illustrating an example of the field winding resistance characteristic stored in the field winding resistance characteristic storage, which explains the field winding interlayer short-circuit detection method for rotating electrical machine according to the modification of the second embodiment.

FIG. 10 is a graph illustrating an example of the field winding resistance characteristic stored in the field winding resistance characteristic storage, which explains the field winding interlayer short-circuit detection method for rotating electrical machine according to the modification of the second embodiment. A characteristic curve A indicates the normal-time field winding resistance characteristic, and a characteristic curve B indicates the abnormal-time field winding resistance characteristic. The abnormal-time field winding resistance characteristic is calculated according to the expression (5) based on the normal-time field winding resistance characteristic.

In FIG. 10, the value of the field winding resistance at the point on the characteristic curve B corresponding to the field winding current detected value $I_F$ is assumed to be $R_{F1}$. Then, it is determined based on the following expression (7) whether the field winding resistance calculated value $R_F$ calculated by the field winding resistance calculator 111 is a value close to $R_F1$.

$$|R_F - R_{F1}| < \beta \qquad (7)$$

As described above, in the second embodiment and its modification, the presence or the absence of the interlayer short-circuit in the field winding 20 is determined using an estimated field winding resistance characteristic, so that it is possible to detect the interlayer short-circuit in the winding in an early stage even in a rotating electrical machine with varying operating conditions.

Other Embodiments

While the embodiment of the present invention has been described, the embodiment is presented by way of example only and are not intended to limit the scope of the invention. While the rotating electrical machine in which the field winding is disposed in the rotor is exemplified in the embodiments, the machine is not limited to this. The machine may include the field winding in the stator.

The embodiments may be combined with each other.

The embodiments may be embodied in other various forms. Various omissions, replacements and changes may be made without departing from the spirit of the invention. The above-described embodiments and variants thereof are within the scope and spirit of the invention, and are similarly within the scope of the invention defined in the appended claims and the range of equivalency thereof.

What is claimed is:

1. A field winding interlayer short-circuit detection apparatus comprising:
    a field winding resistance calculator to calculate, for a field winding of a rotating electrical machine, a field winding resistance calculated value from a detected value of a field winding current and a detected value of a field winding voltage;
    a reference resistance value derivation part to derive a reference resistance value; and
    a determiner to determine presence or absence of an interlayer short-circuit in the field winding by using a comparison result between the field winding resistance calculated value and the reference resistance value.

2. The field winding interlayer short-circuit detection apparatus according to claim 1, further comprising:
    a field winding current detected value storage to store the field winding current detected value;
    a field winding old current value derivation part to derive a field winding old current value based on the field winding current detected value stored in the field winding current detected value storage;
    a field winding current variation calculator to calculate a field winding current variation from the field winding current detected value and the field winding old current value;
    a field winding resistance calculated value storage to store the field winding resistance calculated value calculated by the field winding resistance calculator; and
    a field winding resistance variation calculator to calculate a field winding resistance variation from the field winding resistance calculated value and the reference resistance value, wherein
    the reference resistance value derivation part derives the reference resistance value based on the field winding resistance calculated value stored in the field winding resistance calculated value storage, and
    the determiner determines the presence or the absence of the short-circuit in the field winding based on the field winding current variation and the field winding resistance variation.

3. The field winding interlayer short-circuit detection apparatus according to claim 2, wherein
    the determiner determines that the short-circuit has occurred in the field winding when both the conditions that a rate of change in the field winding current variation is larger than (1/(the number of turns of the field winding−1)) and that a rate of change in the field winding resistance variation is negative, and the absolute value thereof is larger than (1/(the number of turns of the field winding)).

4. The field winding interlayer short-circuit detection apparatus according to claim 1, further comprising a field winding resistance characteristic storage to store a normal-time field winding resistance characteristic indicating dependency of the field winding resistance on the field winding current detected value, wherein
  the reference resistance derivation part derives the reference resistance value using the normal-time field winding resistance characteristic stored in the field winding resistance characteristic storage based on the field winding current detected value, and
  the determiner determines the presence or the absence of the short-circuit in the field winding based on the field winding resistance calculated value calculated by the field winding resistance calculator and the reference resistance value.

5. A field winding interlayer short-circuit detection method comprising:
  a field winding resistance calculation step in which a field winding resistance calculator calculates, for a field winding of a rotating electrical machine, a field winding resistance calculated value from a detected value of a field winding current and a detected value of a field winding voltage;
  a reference resistance value derivation step in which a reference resistance value derivation part derives a reference resistance value; and
  a determination step in which a determiner determines presence or absence of an interlayer short-circuit in the field winding by comparing the field winding resistance calculated value and the reference resistance value.

\* \* \* \* \*